United States Patent [19]

Rivest et al.

[11] Patent Number: 4,691,299
[45] Date of Patent: Sep. 1, 1987

[54] METHOD AND APPARATUS FOR REUSING NON-ERASABLE MEMORY MEDIA

[75] Inventors: Ronald L. Rivest, Arlington, Mass.; Adi Shamir, Rehovot, Israel

[73] Assignee: Massachusetts Institute of Technology, Cambridge, Mass.

[21] Appl. No.: 565,210
[22] PCT Filed: Apr. 30, 1982
[86] PCT No.: PCT/US82/00564
 § 371 Date: Dec. 29, 1983
 § 102(e) Date: Dec. 29, 1983
[51] Int. Cl.$^4$ ............................................ G11C 13/00
[52] U.S. Cl. ...................................... 365/189; 371/13
[58] Field of Search ................. 365/94, 120, 127, 189, 365/200, 215, 168; 369/54, 58, 59; 371/13

[56] References Cited

U.S. PATENT DOCUMENTS

| | | | |
|---|---|---|---|
| 3,609,708 | 8/1982 | Cragon | 340/173 |
| 3,638,185 | 1/1972 | Dell et al. | 340/146.1 |
| 3,897,626 | 8/1975 | Beausolieil | 29/574 |
| 4,545,044 | 10/1985 | Satoh et al. | 369/58 |

FOREIGN PATENT DOCUMENTS 55-113137 8/1982 Japan.

OTHER PUBLICATIONS

Jones et al., "Read-Only Programmable Logic Array with Writable Segment", IBM Tech. Dis. Bul., vol. 17, No. 10, Mar. 1975, p. 2987.
Goldstein, charles M.; "Optical Disk Technology and Information"; Feb. 1982; Science, vol. 215; pp. 862–868.

Primary Examiner—Terrell W. Fears
Attorney, Agent, or Firm—Kenway & Jenney

[57] ABSTRACT

Storage media such as digital optical disks, PROMS, and paper tape consist of a number of bit positions which initially contain a "zero" and which can later be irreversibly overwritten with a "one". An apparatus and method provide for rewriting in such "non-erasable memories" for expanding their capacity by allowing the non-erasable memory to be rewritten one or more time.

16 Claims, 6 Drawing Figures

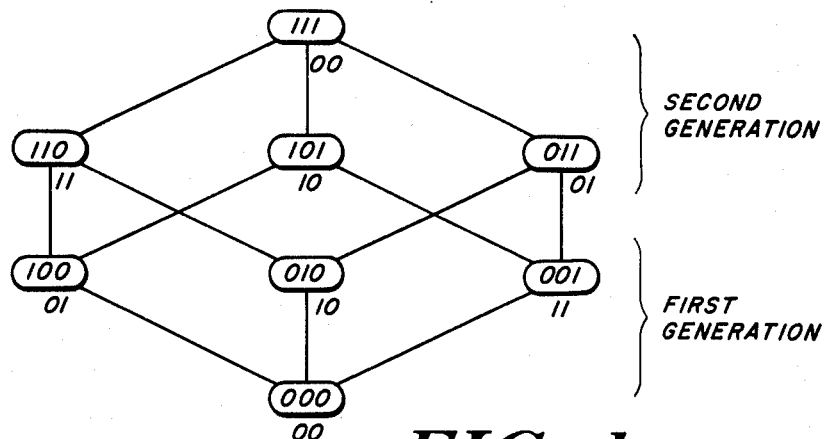
FIG. 1
| x | r(x) | r'(x) |
|----|------|-------|
| 00 | 000  | 111   |
| 01 | 100  | 011   |
| 10 | 010  | 101   |
| 11 | 001  | 110   |
FIG. 2
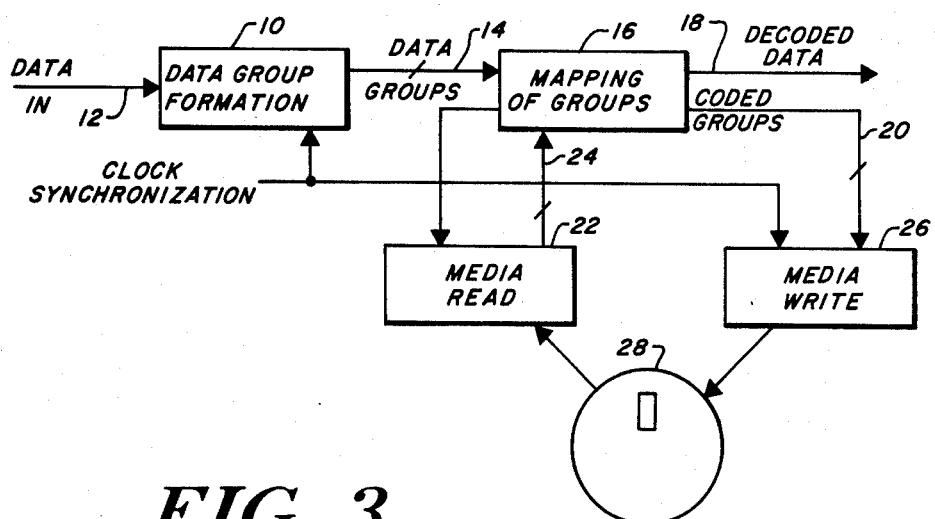
FIG. 3

| ROM<br>LINES 14<br>(x) | INPUT<br>LINES 24 | ROM<br>LINES 18 | OUTPUT<br>LINES 20<br>r(x) OR r'(x) |
|---|---|---|---|
| 00 | 000 | 00 | 000 |
| 00 | 100 | 01 | 111 |
| 00 | 010 | 10 | 111 |
| 00 | 001 | 11 | 111 |
| 01 | 000 | 00 | 100 |
| 01 | 100 | 01 | 100 |
| 01 | 010 | 10 | 011 |
| 01 | 001 | 11 | 011 |
| 10 | 000 | 00 | 010 |
| 10 | 100 | 01 | 101 |
| 10 | 010 | 11 | 010 |
| 10 | 001 | 10 | 101 |
| 11 | 000 | 00 | 001 |
| 11 | 100 | 01 | 110 |
| 11 | 010 | 11 | 110 |
| 11 | 001 | 10 | 001 |
| 00 | 111 | 00 | XXX |
| 00 | 011 | 01 | XXX |
| 00 | 101 | 10 | XXX |
| 00 | 110 | 11 | XXX |
| 01 | 111 | 00 | XXX |
| 01 | 011 | 01 | XXX |
| 01 | 101 | 10 | XXX |
| 01 | 110 | 11 | XXX |
| 10 | 111 | 00 | XXX |
| 10 | 011 | 01 | XXX |
| 10 | 101 | 10 | XXX |
| 10 | 110 | 11 | XXX |
| 11 | 111 | 00 | XXX |
| 11 | 011 | 01 | XXX |
| 11 | 101 | 10 | XXX |
| 11 | 110 | 11 | XXX |

METHOD AND APPARATUS FOR REUSING NON-ERASABLE MEMORY MEDIA

The Government has rights in this invention pursuant to Grant Number MCS 80-06938 awarded by the National Science Foundation.

The invention relates generally to a method and apparatus for writing in data storage systems and in particular to a method and apparatus for writing in a non-erasable storage medium such as a digital optical disk or paper tape.

BACKGROUND OF THE INVENTION

Non-erasable, or write-once, data storage media such as digital optical disks, paper tape, PROMS, etc., have a plurality of bit positions, each of which can be irreversibly changed from an original state to a new state but one time. Thus, typically, the initial state of the bit position is designated a "zero" and the "zero" can be overwritten with a "one" when data is written into the media. Once the data has been written in a section of the media, which may be all of the media, that section is considered to be "used" by those experienced in the field, and is not considered to be reusable thereafter for recording new data.

Some non-erasable media, notably digital optical disks, can store vast amounts of data. A single twelve-inch disk can be used to store over $10^{11}$ bits of data, the equivalent of forty reels of magnetic tape, and access can be provided to any of it in about one-tenth of a second. This is an order of magnitude improvement in the cost/performance of memory technology and has had dramatic effects. And, while the cost of a high capacity, single twelve-inch disk may be only $100, that high capacity and low cost are achieved only at the further philosophical cost of making the writing process irreversible.

Similar limits exist, and are probably more familiar, in connection with the non-erasable media, such as punched paper tape, punched cards, and programmable read only memories (PROMS). However, the tremendous capacity and low cost per bit of digital optical disks provides a strong motivation for more closely examining their one drawback, the non-erasable nature of the memory storage process.

Therefore a primary object of this invention is an apparatus and method for reusing, that is writing more than once in, non-erasable memories. Other objects of the invention are an apparatus and method for reliably and simply increasing the effective capacity of non-erasable memories, and for providing a simple, easily implemented apparatus and method for rewriting in an otherwise non-erasable memory.

SUMMARY OF THE INVENTION

In one aspect, the invention relates to apparatus for reusing a non-erasable memory medium. The apparatus features reading circuitry for reading successive groups of digits from the non-erasable memory medium and a process element for writing over each of the successive groups in accordance with both the input data information read at each successive group and respectively new incoming input-data information. Thus, the process element provides an output in accordance with a predetermined "mapping" procedure or plan which is determined by the two data information sources received above. Thereafter, the "written over" groups of digits can be uniquely read, at a later time, to reproduce the just written new incoming input-data information.

In another aspect, the invention relates to apparatus for writing a plurality of times in a non-erasable memory. The invention features receiving circuitry for receiving incoming digital data and for forming sequential input-data groups from the received data. A reading element reads successive groups of digital data from successive groups of data positions in the non-erasable memory. In response to each formed sequential input-data group and a respective read successive data group from memory, mapping circuitry generates successive new coded groups of digital data. Writing circuitry sequentially writes each of the coded groups of digital data over the corresponding read data group. Thereby, the coded groups of data can be later read and uniquely decoded to generate the previously received incoming digital data. Depending upon the coding or mapping method, the non-erasable medium can be rewritten a substantial number of times.

In yet another aspect, the invention relates to a method for writing a plurality of times in a non-erasable memory. The method features the steps of receiving input digital data, grouping the received input data into sequential groups of data, reading from the memory successive groups of stored digital data, forming new successive groups of write digital data from the stored digital data and the input data sequential groups, and writing the new groups of data over corresponding ones of the read groups from memory in a one-to-one relationship. The new groups of data are uniquely decodable to generate the input digital data.

In yet another aspect, the invention relates to a method for reusing a non-erasable memory medium. This method features the steps of reading successive groups of digits from the non-erasable memory medium, and thereafter writing over each successive group in accordance with (a) the data values of new incoming data information and (b) the just read data information written at the successive positions to be overwritten. The new data written into the medium is generated according to a predetermined mapping method of said data inputs. Thereby, the written-over groups can be uniquely read at a later time to reproduce the incoming data information.

In another aspect of the invention, the apparatus relates to writing a plurality of times at the same group of bit positions (WITS) of a non-erasable digital memory. The apparatus features reading circuitry for reading the data stored at the bit positions and input circuitry for receiving new input data to be retrievably stored at the bit positions. A mapping circuit is responsive to the reading circuit and the input receiving circuit for generating a storeable codeword according to a mapping method, the newly generated codeword being greater than or equal to (as is defined hereafter) the word previously stored at the bit positions. The storeable codeword is then written, by a writing circuit, at the bit positions.

In particular embodiments of the invention, the mapping method can operate either according to a linear womcode or a tabular womcode as those coding methods are described hereinafter. In one particular embodiment of the invention, the mapping circuit employs a read only memory (ROM).

The method of the invention relates to writing a plurality of times at the same group of bit positions of a non-erasable digital memory. The method features the steps of reading the data stored at the bit positions and receiving input data to be retrievably stored at the bit positions. The method further features generating a storeable codeword in response to the read and received data, the storeable codeword being greater than or equal to the word previously stored at the memory bit positions. The method then features writing the storeable codeword at the bit positions, in effect overwriting the previously stored data.

BRIEF DESCRIPTION OF THE DRAWINGS

Other objects, features, and advantages of the invention will become apparent from the following description of preferred particular embodiments of the invention taken together with the drawings in which:

FIG. 1 represents a simple diagrammatic representation of a method for rewriting in a non-erasable memory;

FIG. 2 is a table describing the mapping method used in FIG. 1;

FIG. 3 is a schematic block diagram of apparatus for rewriting in a non-erasable memory;

FIG. 5 is a table showing the optimum word length requirements for various groupings of word length in rewriting a non-erasable memory.

DESCRIPTION OF PARTICULAR PREFERRED EMBODIMENTS

Figures 4A, 4B:
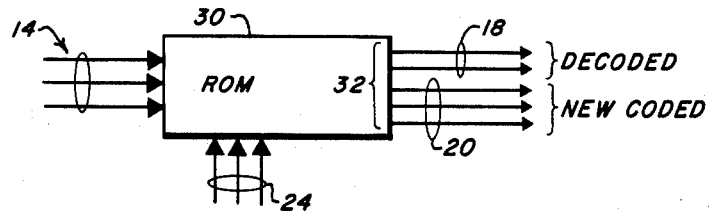
FIGS. 4A–4B are more detailed representations of a mapping element of FIG. 2.

Non-erasable memories, such as digital optical disks, are typically viewed as a write-once memory wherein the capacity of the disk is equal to the number of positions on the disk at which a data bit can be stored. Such thinking however does not take into account the ability to reuse a disk, in the manner set forth below, which, in effect, increases the capacity of the disk substantially. The magnitude of the improvement varies depending upon the particular mapping method employed for reusing the disk and whether or not the memory being "reused" was originally written with that intent. As described below, very simple methods and apparatus can be employed to increase the capacity of a non-erasable medium by a factor of one-third. More complex methods and apparatus can be employed to obtain even more dramatic results.

A non-erasable memory or "write-once memory" is designated a "WOM". Each WOM consists of a number of "write-once bit positions" (called "WITS")j and each WIT initially contains a "zero" that can later be selectively, but irreversibly, overwritten with a "one". Typically, a large WOM can be divided into data blocks or sections that are used as needed, an index being provided for example on an associated magnetic disk, to keep track of the valid blocks. The magnetic disk can be eliminated by using a linked-list or tree-like data structure on the WOM itself to link obsolete blocks to their replacements; however, the effect of storing information on the WOM itself is to increase the cost in terms of access time.

By using mapping or coding methods according to the invention, a WOM can be "rewritten" many times and correspondingly it will have a "bit capacity" which is much greater than the number of its bit positions or WITS. Many of the coding techniques which are disclosed later are both simple to implement and can have a significant impact on the effective cost of using the WOM.

Before describing the invention in more detail, a simple, but very effective, example can be employed to provide the basic understanding of the method for increasing the medium capacity, that is, for "reusing" or "rewriting" a non-erasable memory. Referring to FIGS. 1 and 2, as an example of a coding method to which the present invention is directed, consider a method which employs groups of three WITS or bit positions on the WOM to write two bits of data information twice. That is, by writing once, and then again, in three bit positions of a non-erasable media, one can represent first, the data of a first group of two bits (written once) and, at a later time, the data of a second group of two bits (overwritten upon the same three bit positions used to represent the first group of two bits).

Referring in particular to the table of FIG. 2, the initial two-bit input data value, "x", is written the first time as a three bit position space (three WITS) "y" according to a function $y = r(x)$. Thereafter, data $x_1$ previously written as $y_1 = r(x_1)$, can be "rewritten" in accordance with new input data $x_2$ according to the function $y_2 = r'(x_2)$ for $x_2 \neq x_1$; and $y_2 = y_1$ for $x_2 = x_1$ (that is, if the new data $x_2$ is equal to the old data $x_1$, the pattern $y_1$ is not changed and $y_2 = y_1$). Note that $r'(x_2)$ will have ones wherever $r(x_1)$ does (for any $x_2 = x_1$) so that in going from r to r' one need only change zeros to ones.

The Boolean three-cube of FIG. 1, wherein the lower level of the cube represents the first generation of "writing" and the upper level of the cube represents the second generation of "rewriting", graphically describes the writing sequence.

Decoding of the data is quite easy. The memory word always represents the two-bit value (b+c), (a+c), independent of whether the WOM has been written once or twice. The EXCLUSIVE OR Boolean operation represented by the sign "+" is a standard Boolean operation, is easily implemented, and is well-known to those skilled in the art.

According to the method described in connection with FIGS. 1 and 2, four data bits can be written in three WITS of the WOM. Thus the method described above increases the WOM's capacity by a factor of one-third.

Having introduced the concept of the method and apparatus, it is helpful to introduce some notation which makes the following more general discussion easier. The "weight" of a binary code word is defined to be the number of ones it contains. "x+y" will be used to denote the bit-wise EXCLUSIVE OR of the bit vectors "x" and "y" (which are both assumed to have the same length). A binary word $x = x_1 \ldots x_r$ is said to be "above" another binary word $y = y_1 \ldots y_s$ (denoted "x greater than or equal y"), if $r = s$ and $x_i$ is greater than or equal to $y_i$ for all i between 1 and r. All logs, that is log (x), denote the logarithm to the base of x and the integer value of the logarithm is written log (x).

A mapping method which uses n WITS to represent one of v values so that it can be written a total number of t times (that is, written once and changed $t-1$ times) is denoted as "$(v)^t$/n-womcode". The "/n" can be dropped for an optimal womcode, i.e. one with minimal n. The general case, where the number of values can change from generation to generation, is denoted by $[v_1, \ldots, v_t]$/n-womcode. The notation $w([v_1 \ldots v_t])$ denotes the least n for which a $[v_1, \ldots v_t]$/n-womcode. Similarly, $w([v]^t)$ denotes the number of WITS needed for an optimal $[v]^t$ womcode.

It may seem paradoxical at first that $w([v]^t)$, less than log $(v) \cdot t$ could exist. Intuitively the reason is that only the last value written needs to be accessible, that is, previous values may become irretrievable. In fact, if all previous values were always accessible, then the number of WITS required would be log $(v) \cdot t$.

Referring to FIG. 3, an apparatus for implementing the various mapping methods to be described herein has an input data group formation circuit element 10 for receiving, either serially or in parallel, input data on lines 12. The data group formation element can be, for example, a shift register designed to convert serial input data into input data groups of length k. The thus formed input data groups are provided over lines 14 to a mapping or coding circuit element 16. Element 16 can be, for example, a read only memory (ROM) (FIG. 4A) whose output provides both decoded data over lines 18 and coded data groups over lines 20. The input to the mapping element 16 must include not only the data groups over lines 14 but code words previously written (if any) which are provided from a media read circuit element 22 over lines 24. The media read element 22 reads data groups from a non-erasable medium 28. The media read element 22 operates in a clocked synchronism with a media write circuit element 26. The media write element 26 takes the coded groups of data available on lines 20 and writes them on the non-erasable medium 28, for example a digital optical disk. The synchronization between read element 22 and write element 26, through the coding or mapping element 16, enables the write element to overwrite (or rewrite) at the precise position of previously read WITS (corresponding to the input to the element 16 over lines 24) so that previously written data is overwritten in a known and predetermined manner.

As noted above, the coding element 16 can be for example a read only memory (ROM) 30 (FIG. 4A). The read only memory takes as its inputs, the input data groups on lines 14 and the read data groups on lines 24. These data inputs effectively address a word of the ROM and provide at the output of the ROM 30, a multi-bit word having two parts. One part, over lines 18, represents the decoded data corresponding solely to the media read input over lines 24. The other part, over lines 20, represents the newly coded data corresponding to both the read inputs over lines 24 and the new data inputs over lines 14. Referring to FIG. 4B, a typical ROM map is shown for the mapping sequence and method illustrated in FIGS. 1 and 2. (Alternatively, other hardware logic, well known in the art, for example a discrete component Boolean logic decoding circuit, can be employed to encode the input signals over lines 14 and 24 and to provide the required decoded and newly encoded output signals).

Referring to FIG. 4B, it is interesting to note that when an already overwritten three-WIT data word is read, and because no further writing is permitted, the output over lines 20 can be any convenient value. This flexibility can be employed to reduce the size of the ROM by combining a smaller capacity ROM with various logic elements to provide the necessary mapping called for by the method represented in FIGS. 1 and 2.

While completely general observations regarding optimal coding methods have not beem completely worked out, the table of FIG. 5 provides some available information regarding the minimal size for $w([2^K]^t)$. Obviously, $w([2^K]^1)$ equals k and $w([2^1]^t)$ equals t. The remaining numbers have been derived either by hand or using automated methods.

Included in the patented file is appendix 1 which is a copy of a paper prepared by the inventors herein which describes in greater detail various aspects of the reuse of a non-erasable memory. That paper details much of the theory which has been employed in determining the advantages of the invention and in determining several methods for generating mapping systems to enable efficient transformations to be derived. The substantive work described in that paper, with the exception of that described in Section VI, is the joint work of the inventors herein although editorial comments regarding the paper have been received from other sources.

EXAMPLES OF OTHER METHODS FOR FORMING WOMCODES

The Tabular $[v]^t$/n-Womcode

It is first assumed that t is greater than v. Further, let u denote an integer parameter to be chosen later (u to be chosen to be about equal to log (n)). The $[v]^t$/n-womcode will have its $n = r \cdot s$ WITS considered as $r = (u+1)(v-1)$ rows of $s = \log (v) + t/(u \cdot (v-1))$ columns. Each row is divided into a log (v)-WIT "header" field and an (s-log (v))-WIT "count" field. The log (v)-bit value represented by such a table is the sum (mod v) of the header fields of all rows that have an odd number of "1"s in their count fields.

Thus, to write a value x when the table currently represents y, it suffices to change a single "0" to a "1" in the count field of a row having the header x-y(mod v). If every row with this header has all ones in its count field, we find a new row which is currently all zeros both in its header and count fields, change the header to the desired value, and change one bit of the count field. We can always find a new row up until $u(v-1)$ rows are completely "full", since there are only $v-1$ useful header values (the all zero value is useless as a header). Thus, we are guaranteed at least $u(v-1) \cdot (s-\log (v)) = t$ writes.

Since $n = r \cdot s = t + t/u + \log (v)(u+1)(v-1)$, choosing u equal to the integer value of log (t) implies $n = t + o(t)$. This code has a rate approximately log (v) which is less than log (n). The rate is the capacity per WIT of the womcode. With optimally chosen parameters, this code has a rate nearly equal to log (n) and is about twice as good as any other code described herein.

The "Linear" Womcode

This method employs the parameters v, $t = 1 + v/4$, and $n = v - 1$. The ith WIT is associated with the numer i for i between 1 and $v-1$. The value represented by any pattern is the sum (mod v) of the numbers associated with the WITS in the one state. (As an alternate definition, useful when v equals a power of 2, the pattern is interpreted as the EXCLUSIVE OR of the k-bit representations of the numbers associated with the WITS in the "1" state. For example, the $[2^2]^2/3$ womcode of example 1 is a Linear womcode, and the coded pattern abc can be decoded as $01 \cdot a + 10 \cdot b + 11 \cdot c$.)

According to this code, so long as there are at least v/2 zeros, the W can be changed to represent a new value by changing at most two WITS. Thus, the mapping described above has a rate roughly equal to log (v)/4 which is approximately equal to log (n)/4.

A $[2^2]^5/7$ Womcode

A $[2^2]^5/7$ (a rate equal to 1.42 approximately) womcode has been developed by an ad hoc method. The pattern is denoted as a seven WIT word abcdefg. If the pattern has a weight equal to four or less, the value represented is $01 \cdot c_{01} + 10 \cdot c_{10} + 11 \cdot c_{11}$, where $c_{01} = 1$ if and only if ab equals 10 or (ab=11 and one of cd or ef is 01), $c_{10} = 1$ if and only if cd=10 or (cd=11 and one of ab or ef is 01), and $c_{11} = 1$ if and only if ef=10 or (ef=11 and one of ab or cd is 01). For example, the pattern 1101100 represents 10. At most, one of ab, cd, or ef will be 11 if another is 01. Otherwise, the pattern is interpreted as the EXCLUSIVE OR of ab, cd, ef, and gg. The first three writes change at most one WIT while the last two writes may change two WITS.

Additions, substractions, deletions, and other modifications of the disclosed particular embodiments of the invention, including new coding or mapping methods, will be obvious to those practiced in the art and are within the scope of the following claims.

What is claimed is:

1. Apparatus for writing a plurality of times in a non-erasable memory comprising
   means for receiving incoming digital data and for forming sequential groups from said received data,
   means for reading successive groups of digital data from successive groups of positions in the non-erasable memory,
   means responsive to each said formed sequential group and to a respective read successive group from memory for generating successive new coded groups of digital data, and
   means for sequentially writing into said memory each said group of data at a said group of positions corresponding to said respective read group of data,
   whereby said coded groups of data can be later read and uniquely decoded to generate said formed sequential groups.

2. The apparatus of claim 1 wherein said non-erasable memory, prior to storage of any data, is comprised in its data storage area a succession of "zeros" and wherein data is stored by converting one or more of said "zeros" to "ones", and further wherein
   said responsive means comprises means for writing a non-decreasing number of "ones" as said groups of positions are written over.

3. In a non-erasable digital memory having groups of bit positions with data stored therein, apparatus for writing a plurality of times at the same group of bit positions of said non-erasable digital memory comprising
   means for reading the data stored at said bit positions,
   means for receiving input data to be retrievably stored at said bit positions,
   means responsive to said reading means and said receiving means for generating a storeable codeword, said codeword being greater than or equal to the word previously stored at said bit positions, and
   means for writing said storeable codeword at said bit positions.

4. The apparatus of claim 3 further comprising
   means connected to said reading means for uniquely converting said read data to output data.

5. The apparatus of claim 3 wherein said responsive means comprises
   means for generating said storeable codeword according to a linear womcode.

6. The apparatus of claim 3 wherein said responsive means comprises
   means for generating said storeable codeword according to a tabular womcode.

7. The apparatus of claim 3 wherein said responsive means comprises
   a read only memory element responsive to said reading means and said receiving means for generating said storeable codeword.

8. The apparatus of claim 7 wherein said read only memory further converts said read data to a decoded data word.

9. A method for writing a plurality of times in a non-erasable memory comprising the steps of
   receiving input digital data;
   grouping said received input data into sequential groups of input data;
   reading from said memory successive groups of stored digital data,
   forming successive groups of write digital data from said stored digital data and said input data sequential groups, said groups of write data being uniquely decodable to generate said input digital data, and
   writing said groups of write data at memory positions corresponding to respective ones of said read groups of data in a one-to-one relationship.

10. The method of claim 9 further comprising the step of repeating said receiving, grouping, reading, forming and writing steps for writing a next sequence of input data in said non-erasable memory.

11. A method for writing a plurality of times at the same group of bit positions of a non-erasable digital memory having groups of bit positions with data stored therein, comprising the steps of
    reading the data stored at said bit positions,
    receiving input data to be retrievably stored at said bit positions,
    generating a storeable codeword in response to said reading and receiving steps, said codeword being greater than or equal to the word previously stored at said bit positions, and
    writing said storeable codeword at said bit positions.

12. The method of claim 11 further comprising the step of
    converting said data read during said reading step to output data.

13. The method of claim 13 wherein said generating step comprises the step of generating said storeable codeword according to a linear womcode.

14. The method of claim 11 wherein said generating step comprises the step of generating said storeable codeword according to a tabular womcode.

15. The method of claim 11 wherein said generating step comprises generating said storeable womcode using a read only memory element.

16. The method of claim 15 wherein said generating step comprises the step of converting said read data to decoded output data words.

* * * * *